(12) United States Patent
Naik

(10) Patent No.: US 7,830,119 B2
(45) Date of Patent: Nov. 9, 2010

(54) ADAPTIVE BATTERY ESTIMATOR AND METHOD

(75) Inventor: Sanjeev M. Naik, Troy, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 584 days.

(21) Appl. No.: 11/846,529

(22) Filed: Aug. 29, 2007

(65) Prior Publication Data

US 2009/0058367 A1 Mar. 5, 2009

(51) Int. Cl.
*H02J 7/00* (2006.01)
*G01R 31/36* (2006.01)
*G01N 27/416* (2006.01)

(52) U.S. Cl. .................... 320/132; 702/63; 324/433

(58) Field of Classification Search ............... 320/132, 320/134, 136; 324/426, 427, 428, 430, 431, 324/432, 433; 702/63
See application file for complete search history.

(56) References Cited

U.S. PATENT DOCUMENTS

| 6,812,670 | B2 * | 11/2004 | Minamiura et al. | 320/116 |
| 7,009,402 | B2 * | 3/2006 | Yumoto et al. | 324/433 |
| 7,564,221 | B2 * | 7/2009 | Asai et al. | 320/132 |
| 2006/0181245 | A1 * | 8/2006 | Mizuno et al. | 320/132 |
| 2007/0132456 | A1 * | 6/2007 | Salman et al. | 324/426 |

* cited by examiner

*Primary Examiner*—Edward Tso
*Assistant Examiner*—M'Baye Diao

(57) ABSTRACT

An adaptive battery estimation control system includes a fixed and adaptive battery estimators effective for a battery parameter estimations across a wide range of dynamic battery operational conditions.

17 Claims, 4 Drawing Sheets

ADAPTIVE BATTERY ESTIMATOR AND METHOD

TECHNICAL FIELD

The present invention relates to estimation of battery dynamics.

BACKGROUND

Accurate estimates of battery dynamics may be used to improve many vehicle control systems, such as a control system associated with regenerative brake blending, and in vehicles including increased electrical content. For example, battery dynamics estimation may enable enhanced prognostics and battery controls. To provide increased vehicle system control, a greater number of sensors are being included with a vehicle. Including a greater number of sensors may increase the burden on the electrical system of a vehicle, of which the battery is a major component.

Several methods exist and are known in the art for estimating battery dynamics. However, existing methods relate primarily to "slow" battery dynamics and are typically limited to the battery state-of-charge (SOC). A battery also includes "fast" battery dynamics, which may include the battery voltage and the battery current. The "fast" battery dynamics may fluctuate at a rate much greater than the battery state-of-charge, thereby rendering estimations of state-of-charge unable to accurately reflect all battery dynamics.

SUMMARY

A method of adaptively estimating battery dynamics using an adaptive battery control system in operative communication with at least one battery includes estimating a battery terminal voltage, internal resistance, and current from a desired power request and from a plurality of battery dynamics inputs. Further, predicted battery terminal voltage and current, and an updated estimated battery internal resistance based on the estimated battery terminal voltage, the estimated battery internal resistance, and the estimated battery current are determined.

BRIEF DESCRIPTION OF THE DRAWINGS

One or more embodiments will now be described, by way of example, with reference to the accompanying drawings, in which.

DETAILED DESCRIPTION

Disclosed herein is an adaptive battery estimation control system, and a method of using the adaptive battery estimation control system in a vehicle having a battery, a vehicle electrical system, and a vehicle battery control module. The vehicle battery control module may comprise any combination of hardware, including but not limited to: microprocessors and computer memory devices; and software, the software operating to control the operation of the hardware and the vehicle battery.

As defined herein, a battery may be any device or combination of devices operating to receive, store, and discharge an electrical charge.

The adaptive battery estimation control system uses a plurality of sensors in signal communication with the vehicle battery control module to estimate ether or both battery voltage and battery current when the vehicle electrical system is placed under load or receives a charge.

The adaptive battery estimator includes a plurality of modules that cooperate to process input signals received from a plurality of sensors associated with a vehicle and a vehicle electrical system. The adaptive battery estimator operates to evaluate the received input signals to determine the battery parameters including, but not limited to: battery voltage, battery state-of-charge, battery power, and battery rated capacity. As used herein the term "module" or "modules" is defined as one or more units capable of processing or evaluating signals input into or stored within the vehicle battery control module including a fixed battery estimator and an adaptive battery estimator. Each module may be a stand-alone unit or a plurality of units comprising hardware or software or a combination thereof.

More particularly, in an embodiment, each of the plurality of sensors electronically communicates a battery voltage signal to a vehicle battery control module. The vehicle battery control module also electronically receives a power request. The power request may be any electrical load placed upon a vehicle electrical system and may be made by a vehicle user or a vehicle system.

The vehicle battery control module may also electronically receive an actual or reported and estimated state-of-charge signal used to estimate open circuit voltage of the battery from the battery state-of-charge sensor. The control module 14, using estimated open circuit voltage of the battery and the power request, determines an estimated and a predicted voltage; an estimated and a predicted current; and an estimated internal resistance, or any combination thereof.

Figure 1:
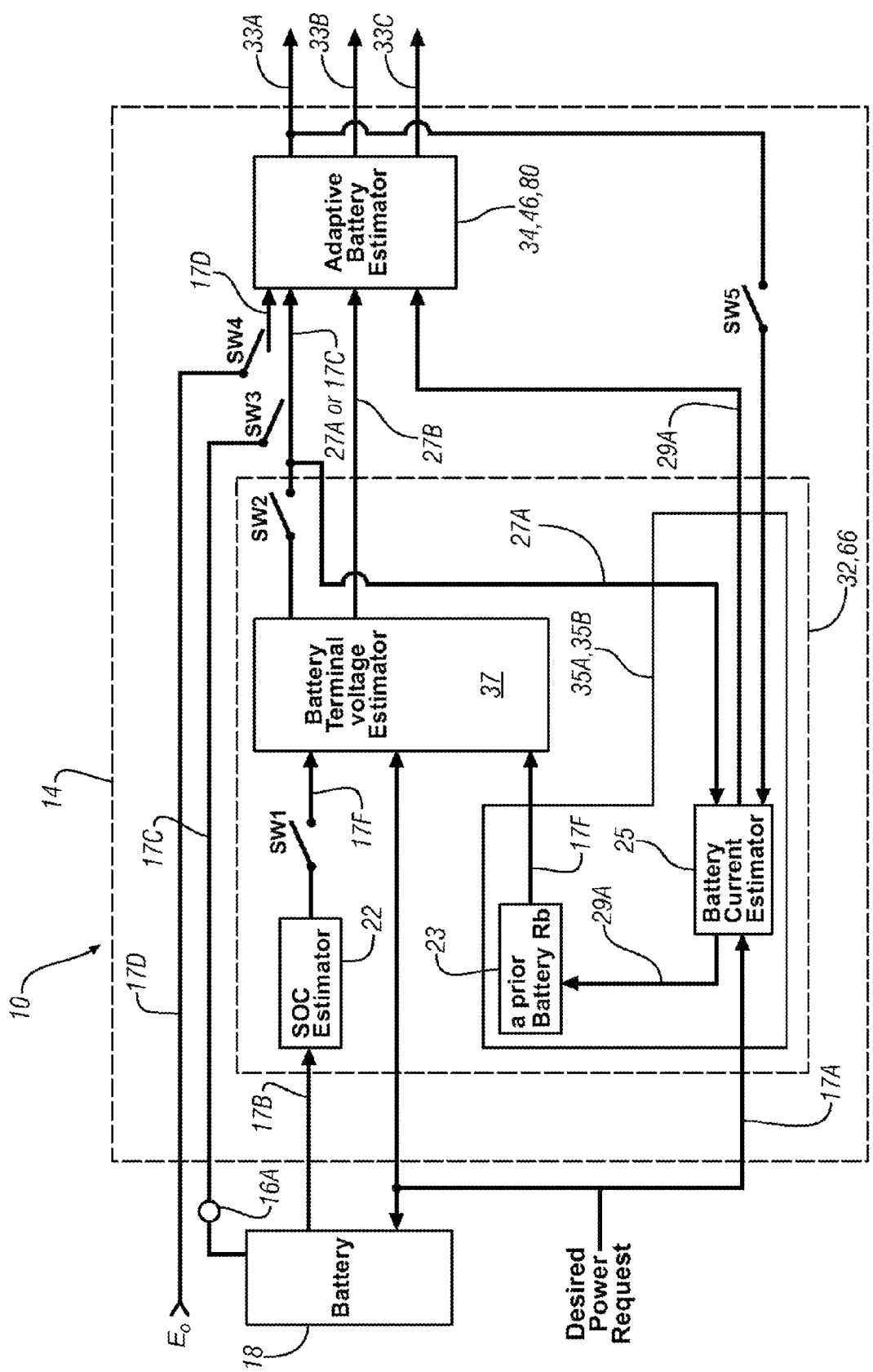
FIG. 1 is a schematic illustration of a vehicle battery control module in signal communication with a vehicle battery in accordance with the present disclosure.

FIG. 1 illustrates an adaptive battery estimation control system 10 in a vehicle (not shown) having a vehicle battery control module 14 in bi-directional communication with a plurality of sensors, including a battery terminal voltage sensor 16A, provided to communicate signals from a number of vehicle systems and in particular from a battery 18 to the vehicle battery control module 14.

More particularly, the control module 14 includes a fixed battery estimator 32 used to determine an estimated battery terminal voltage, an estimated battery internal resistance, and an estimated battery current based on a measured or estimated terminal voltage and a desired power request. Control module 14 also includes an adaptive battery estimator 34 used to determine a predicted battery terminal voltage, a predicted battery current, and an estimated battery internal resistance based on the measured battery terminal voltage, the estimated battery internal resistance, and the estimated battery current input into the adaptive battery estimator 34 from the fixed battery estimator.

In an embodiment, when an open circuit voltage of the battery is a function of the battery's SOC, the vehicle battery control module 14 is placed in electrical and signal communication with a SOC estimator module 22. The SOC estimator module 22 operates to provide the vehicle battery control module 14 with an estimated SOC, or an estimated open-circuit voltage (estimated $V_{oc}$).

In one embodiment, the adaptive battery estimation control system 10 estimates and predicts battery dynamics including an estimated battery terminal voltage in response to changing vehicle electrical system conditions based on battery SOC and a desired power request.

In an embodiment, shown in FIG. 1, the fixed battery estimator 32 includes a SOC estimator 22, an a priori battery resistance estimator 23, a battery current estimator 25, and a battery terminal voltage estimator 37. The fixed battery estimator 32 is in signal communication with the battery 18, with a desired power request signal 17A, and with the adaptive battery estimator 34 when the battery 18 is not in a low battery power state or condition, and thus, when SW1 and SW2 are closed.

In an embodiment when the battery 18 is not in a low battery state, the fixed battery estimator 32 receives a desired power request, $P^*_b(k)$ at a time sample k via desired power signal 17A, from a remote location, a state-of-charge signal 17B from the battery 18 and outputs both an estimated battery terminal voltage $\hat{V}_b^o(k)$ via estimated battery terminal voltage signal 27A and an estimated internal battery resistance $\hat{R}_b^o(k)$ via estimated internal battery resistance signal 27B to the adaptive battery estimator 34.

In an embodiment when the battery 18 is not in a low power state, the state-of-charge signal 17B is input into the state-of-charge estimator 22 to estimate an open circuit voltage $\hat{V}_{oc}(k)$ via estimated open circuit voltage signal 17F, wherein the open circuit voltage $\hat{V}_{oc}(k)$ is a function of the battery state-of-charge, wherein the state-of-charge signal 17B is based on an estimated state-of-charge or a reported state-of-charge. The open circuit voltage signal 17F, an internal battery resistance signal 17E, and the desired power request signal 17A are input into the fixed battery terminal estimator 37 to determine the estimated battery terminal voltage $\hat{V}_b^o(k)$.

In an embodiment, the estimated battery terminal voltage $\hat{V}_b^o(k)$ is output via an estimated battery terminal signal 27A to both the adaptive battery estimator 34 and back to the fixed battery estimator 32 via a feedback control loop 35A, which includes signals 27A, 29A, and 17E.

The feedback control loop 35A inputs the estimated battery terminal voltage signal 27A from the last time sample (k-1) into the battery current estimator 25, wherein the battery current estimator 25 determines an estimated current $\hat{I}_b(k)$ via an estimated battery current signal 29A. The estimated battery current signal 29A is input into the a priori internal battery resistance estimator 23 to determine an estimated internal battery resistance $\hat{R}_b^o(k)$ via an estimated internal battery resistance signal 17E, which is then input into the fixed battery terminal voltage estimator 37 and from there also to the adaptive battery estimator 34 via line 27B.

More particularly, the battery current estimator 25 determines an estimated battery current signal 29A based on both the desired power request signal 17A, and the estimated battery terminal voltage signal 27A from the last time sample (k-1). The feedback control loop 35A operates to continuously update and estimate the internal battery resistance $\hat{R}_b^o(k)$.

Figure 2:
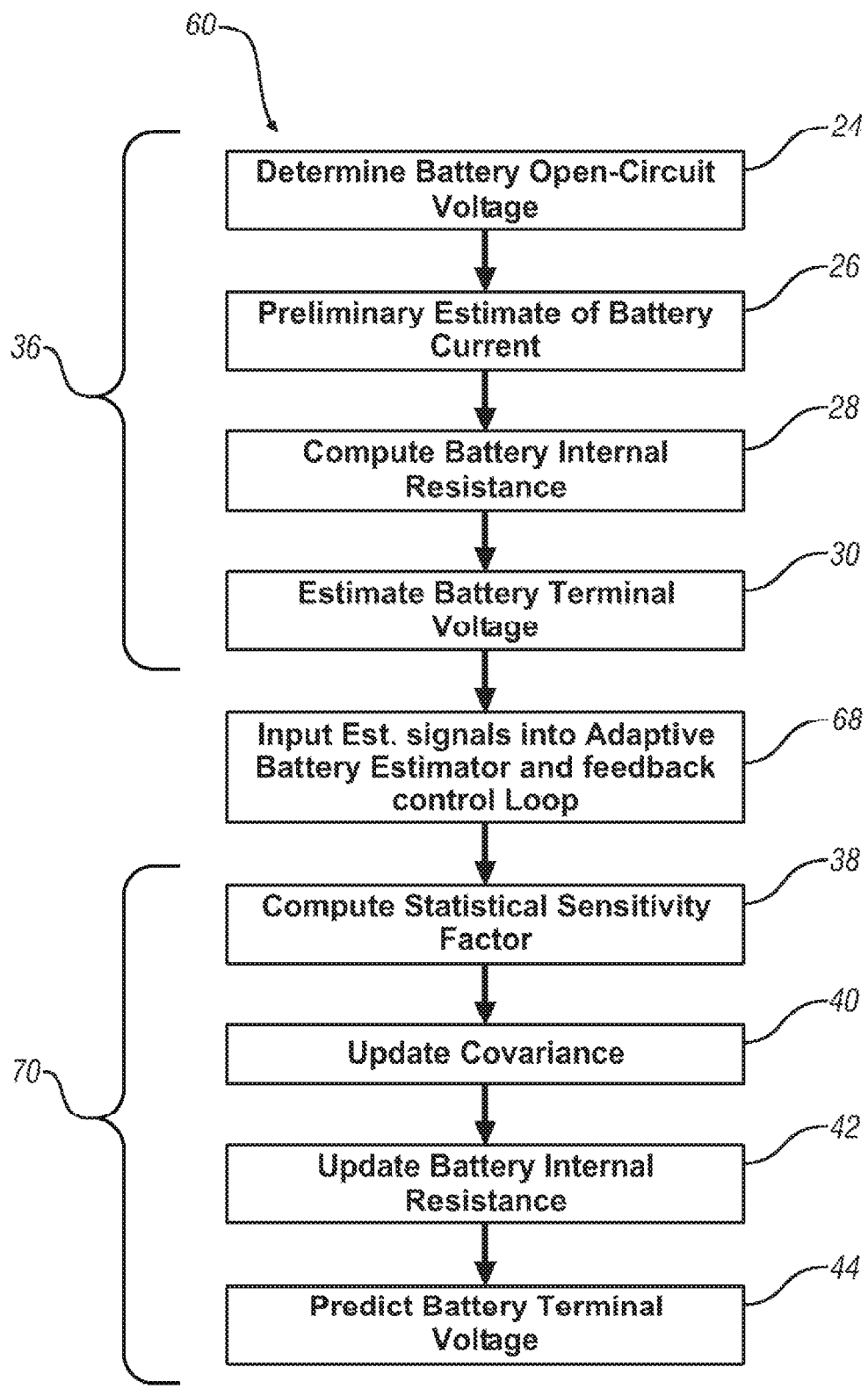
FIG. 2 is a flow chart illustrating a method of adaptively estimating battery dynamics using an adaptive battery control system in accordance with the present disclosure.
Figure 3:
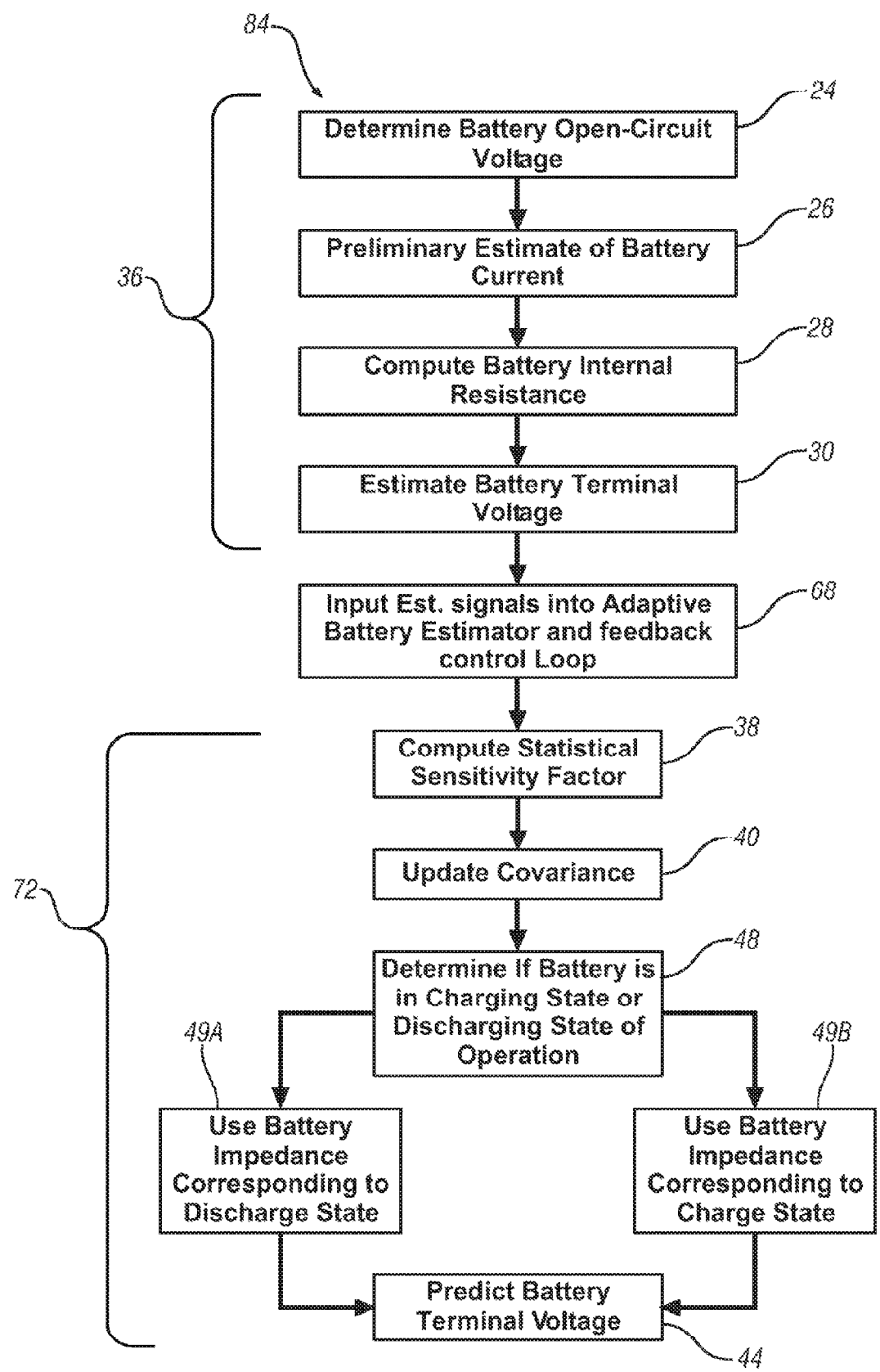
FIG. 3 is a flow-chart illustrating a method of adaptively estimating battery dynamics using an adaptive battery control system in accordance with the present disclosure.
Figure 4:
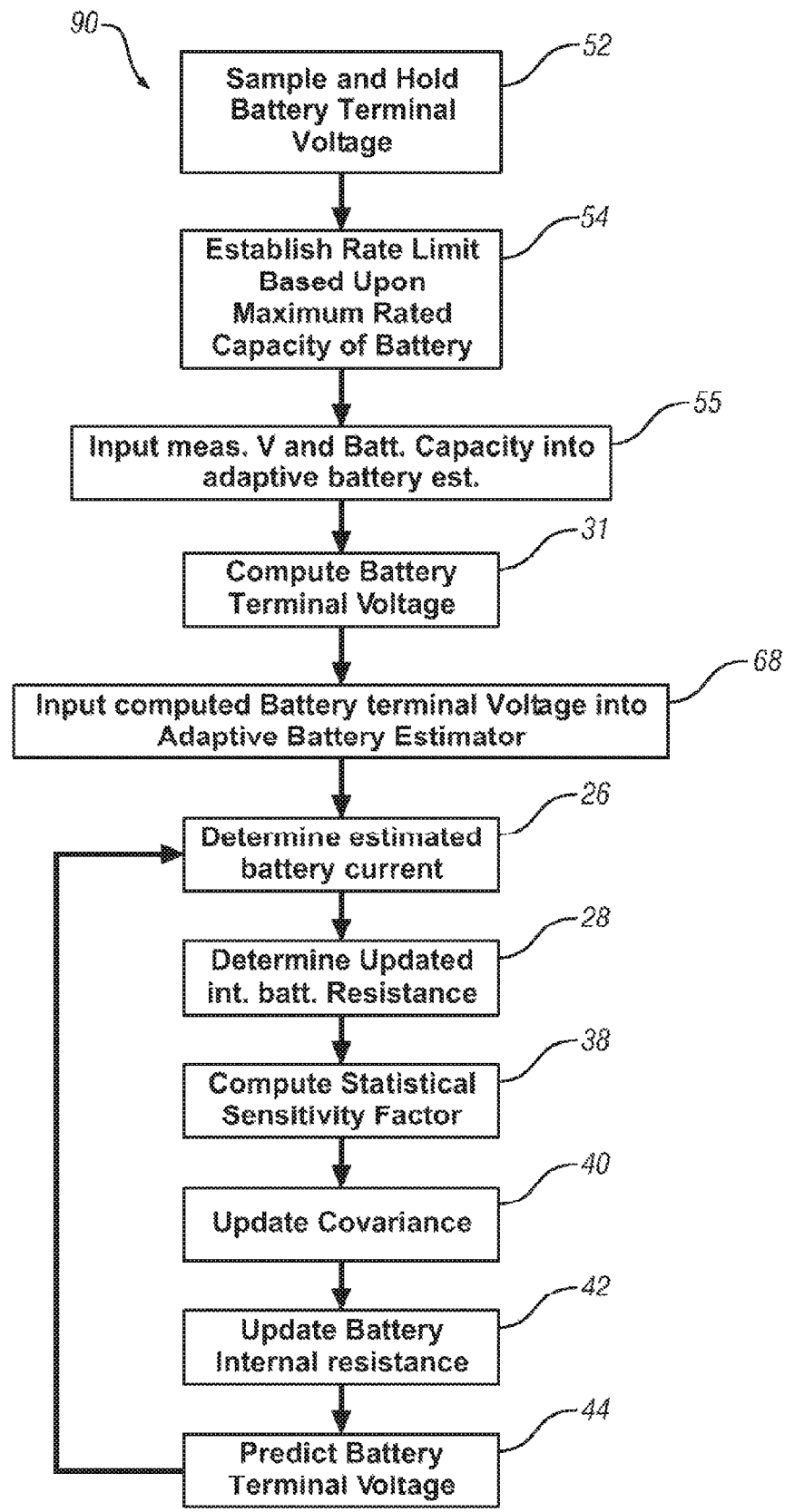
FIG. 4 is a flow-chart illustrating a method of adaptively estimating battery dynamics using an adaptive battery control system in accordance with the present disclosure.

With additional reference to FIGS. 2-4 which illustrate various methods in accordance with the present disclosure, bracketed reference numerals (#) correspond to portions of such methods. In an embodiment, a method (60) for adaptively estimating and predicting battery dynamics is shown in FIG. 2. More particularly, the control module 14 includes a fixed battery estimator 32 (36) used to determine an estimated battery terminal voltage, an estimated battery internal resistance, and an estimated battery current based on an estimated open circuit voltage and a desired power request, and then uses an adaptive battery estimator 34 to determine a predicted battery terminal voltage, a predicted battery current, and an estimated battery internal resistance based on the estimated battery terminal voltage, the estimated battery internal resistance, and the estimated battery current input into the adaptive battery estimator 34 (70) from the fixed battery estimator 32 (36).

Initially, the battery open circuit voltage ($\hat{V}_{oc}(k)$) is determined (24) by the vehicle battery control module 14 as a function of the SOC. The SOC may be either estimated or reported. In an embodiment wherein the SOC is reported, the SOC may be reported as information, which is typically collected at the battery cell during battery cell characterization. In an embodiment where the SOC is estimated, the SOC may be estimated by a variety of statistical estimation methods, as is known in the art.

Determination of $\hat{V}_{oc}(k)$ (24) may be made using Equation (1):

$$\hat{V}_{oc}(k) = f(SOC(k)) \qquad (1)$$

wherein $\hat{V}_{oc}$ is the determined open circuit voltage of the battery, k represents a discrete time sample and comprises an integer, and SOC is the state-of-charge. The sampling rate T (not shown) may vary. In one embodiment, the time sampling rate T is 8 milliseconds.

Once $\hat{V}_{oc}$ is determined, as illustrated in FIG. 2, a preliminary estimation of battery current is determined (26) by the battery current estimator 25 using Equation (2):

$$\hat{I}_b(k) = P^*_b(k)/\hat{V}_b(k-1) \qquad (2)$$

wherein $\hat{I}_b$ is the preliminary estimation of battery current, k is the time sample as disclosed in Equation (1), $P^*_b$ is desired power request representing power flowing out of the battery 18, and $\hat{V}_b$ is the estimated battery terminal voltage of the battery 18.

The determined preliminary estimate of battery current ($\hat{I}_b$) (26) is then used to compute the battery internal resistance ($\hat{R}_b^o$) (28) using Equation (3):

$$\hat{R}_b^o(k) = \begin{cases} \text{KeHVBR\_R\_HVBatResistanceDisChg} & \text{if } \hat{I}_b(k) > 0 \\ \text{KeHVBR\_R\_HVBatResistanceChg} & \text{if } \hat{I}_b(k) \leq 0 \end{cases} \qquad (3)$$

wherein $\hat{R}_b^o$ is the battery internal resistance, k is the time sample and comprises an integer, KeHVBR_R_HVBatResistanceDisChg is a variable corresponding to the battery 18 being in a discharge state if $\hat{I}_b(k) > 0$ as determined in Equation (2), and KeHVBR_R_HVBatResistanceChg is a software functionality module corresponding to the battery 18 being in a charging state if $\hat{I}_b(k)$ is a value that is less than zero.

Next, as illustrated in FIG. 2, each of the battery circuit open voltage ($\hat{V}_{oc}(k)$), the preliminary estimate of battery current ($\hat{I}_b$), and the battery internal resistance ($\hat{R}_b^o$) parameters are used to estimate the battery terminal voltage (30) through a relationship derived from Equations (1) through (3), wherein the relationship defines estimated battery terminal voltage $\hat{V}_{be}^o(k)$ determined by the fixed battery estimator 32. The fixed battery estimator determines a linear battery terminal voltage using Equation (4):

$$\hat{V}_{b_e}^0(k) = \frac{\hat{V}_{oc}(k) + \sqrt{\hat{V}_{oc}^2(k) - 4\hat{R}_b^0(k)P_b^*(k)}}{2} \quad (4)$$

wherein each of the variables are defined in Equations (1)-(3).

Once determined, $\hat{V}_{b_e}^0(k)$ and other estimated signals are input (68) into the adaptive battery estimator 34. A predicted voltage value $\hat{V}_{b_p}^0(k)$ via predicted battery terminal voltage signal 33A is determined by the non-linear adaptive battery estimator 34 (70), enabling the vehicle battery control module 14 to track, estimate, and predict battery dynamics online.

In an embodiment, the non-linear adaptive battery estimator 34 uses logic to determine the predicted voltage value $\hat{V}_{b_p}^0(k)$ using the estimated battery terminal voltage $\hat{V}_{b_e}^0(k)$ derived from the fixed battery estimator 32 as determined in Equation (4), as represented in Equation (5):

$$\hat{V}_{bp}(k) \cong \hat{V}_{be}^0(k) + \frac{\partial V_b}{\partial R_b}\bigg|_{R_b=\hat{R}_b^0(k)} \times d\hat{R}_b(k) \quad (5)$$

wherein $R_b$ is an updated estimated internal battery resistance of the battery 18 determined by the fixed battery estimator 32 and $d\hat{R}_b(k)$ is a change in the estimated internal battery resistance as determined by the adaptive battery estimator in Equation (8) below, and wherein $$\frac{\partial V_b}{\partial R_b}\bigg|_{R_b=\hat{R}_b^0(k)}$$

is a change in the estimated battery terminal voltage with respect to a change in the estimated internal battery resistance.

More particularly, Equation (5) calculates $$\frac{\partial V_b}{\partial R_b}\bigg|_{R_b=\hat{R}_b^0(k)}$$

as follows:

$$\frac{\partial V_b}{\partial R_b}\bigg|_{R_b=\hat{R}_b^0(k)} = \frac{-P_b^*(k)}{\sqrt{\hat{V}_{oc}^2(k) - 4\hat{R}_b^0(k)P_b^*(k)}} \quad (6a)$$

In one embodiment, $$\frac{\partial V_b}{\partial R_b}\bigg|_{R_b=\hat{R}_b^0(k)}$$

represents a statistical sensitivity factor determined (38) in Equation (6a):

$$\phi(k) = \frac{\partial V_b}{\partial R_b}\bigg|_{R_b=\hat{R}_b^0(k)} \quad (6b)$$

wherein φ represents the statistical sensitivity factor and k represents a time sample and comprises an integer.

Using φ determined in Equation (6b), the adaptive battery estimator 34 then determines a covariance P(k) (40), wherein the covariance is determined using Equation (7):

$$P(k) = \frac{1}{\alpha}\left[P(k-1) - \frac{P^2(k-1)\phi^2(k)}{\alpha + P(k-1)\phi^2(k)}\right] \quad (7)$$

wherein α is a fixed variable.

After updating the covariance, the adaptive battery estimator 34 calculates an update to the battery internal resistance ($\hat{R}_b^0$) (42) using Equation (8):

$$d\hat{R}_b(k) = \quad (8)$$
$$d\hat{R}_b(k-1) + \frac{1}{\alpha + P(k-1)\phi^2(k)}P(k-1)\phi(k)(V_b(k) - \hat{V}_b(k-1-d))$$

wherein d represents a corrective factor that may provide tuning or correction of measurement and of lag in measurement. Additionally, the corrective factor d may provide correction for other battery or system parameters, the tuning of which would provide an optimization of the function of the adaptive battery control module 14.

In an embodiment, the value of $$\phi(k) = \frac{\partial V_b}{\partial R_b}\bigg|_{R_b=\hat{R}_b^0(k)}$$

is substituted in Equation (5) with φ(k) derived from Equations (6a) and (6b) to determine the predicted battery terminal voltage as $\hat{V}_{b_p}(k)$ (44) defined in Equation (9):

$$\hat{V}_{b_p}(k) \cong \hat{V}_b^0(k) + \phi(k)^*d\hat{R}_b(k) \quad (9)$$

During use of a vehicle including a battery 18, the internal resistance, interchangeably referred to herein as impedance, of the battery 18 may change, depending upon the operating condition of the battery 18. The operating conditions of the battery 18 may include the battery 18 being charged by a power source, the battery 18 being discharged to a load, or the battery 18 maintaining a given charge. To account for variations in battery impedance, another embodiment is provided, wherein an adaptive battery estimator 46 is provided to account for differences in battery impedance caused by differing battery operating conditions.

In an embodiment illustrated in FIG. 3, a method (84) operates to adaptively estimate and predict battery dynamics. Initially, a fixed battery estimator 66 (36) operates to estimate the battery dynamics in the same manner as the fixed battery estimator 32 as shown in FIG. 2. The updated estimated internal battery resistance reflecting a change in the internal battery resistance is calculated by an adaptive battery estimator 46 depending on whether the battery is in a charging or a discharging state (48), (49A), (49B). The adaptive battery estimator 46 determines the statistical sensitivity factor φ(k) (38) as disclosed in Equations (6a) and (6b), and the covariance P(k) (40) as disclosed in Equation (7). However, unlike the adaptive battery estimator 34 (70), the adaptive battery estimator 46 (72) substitutes Equation (8) with Equations (10a) and (10b) as follows to determine $d\hat{R}_b(k)$. The selected $d\hat{R}_b(k)$ is then used to calculate the predicted battery terminal voltage $\hat{V}_{b_p}(k)$ as disclosed in Equation (9) and determines whether the battery is in a discharging state wherein the power P*(k) is greater than zero or a charging state wherein P*(k) is less than or equal to zero (48) and includes the following process, to be used by adaptive battery estimator 46, according to the value of P*(k), as shown in Equations (10a) and (10b):

If $$P_*(k) < 0, \tag{10a}$$

then $$d\hat{R}_{b,chg}(k) = d\hat{R}_{b,chg}(k-1) + \frac{1}{a + P(k-1)\phi^2(k)} P(k-1)\phi(k)\left(V_b(k) - \hat{V}_b(k-1-d)\right)$$

wherein $$d\bar{R}_b(k) = d\hat{R}_{b,chg}(k).$$

If $$P_*(k) \geq 0 \tag{10b}$$

$$d\hat{R}_{b,dischg}(k) = d\hat{R}_{b,dischg}(k-1) + \frac{1}{a + P(k-1)\phi^2(k)} P(k-1)\phi(k)\left(V_b(k) - \hat{V}_b(k-1-d)\right)$$

wherein $d\hat{R}_b(k) = d\hat{R}_{b,dischg}(k)$. In Equations (10a) and (10b), $d\hat{R}_{b,chg}$ is the impedance of the battery 18 when the battery 18 is in a charging operating condition and $d\hat{R}_{b,dischg}$ is the impedance of the battery 18 when the battery 18 is in a discharging operating condition.

In an embodiment, the adaptive battery estimator 46 may switch between $d\hat{R}_{b,dischg}$ (49A) and $d\hat{R}_{b,chg}$ (49B) of Equations (10a) and (10b), using a battery impedance corresponding to a discharge state of operation of the battery 18, or a battery impedance corresponding to a charging state of the battery 18, represented by $d\hat{R}_{b,dischg}$ and $d\hat{R}_{b,chg}$ respectively, in the above equations and illustrated in FIG. 3.

In another embodiment a method (90) of adaptively estimating and predicting battery dynamics is shown in FIG. 4. Adaptive battery estimator 80 estimates and predicts battery dynamics including an estimated battery terminal voltage in response to changing vehicle electrical system conditions based on a measured battery terminal voltage, a maximum battery rated capacity ($E_o$) and a desired power request when the battery 18 is in a low power state or condition.

In another embodiment, the adaptive battery estimator 80 determines an estimate of battery dynamics without requiring an estimate of the $V_{oc}$ of the battery 18 when the battery is in a low power condition. The battery terminal voltage $V_b$ is not estimated using the fixed battery estimator 66, but rather is determined from a measured battery terminal voltage V(k) and a maximum rated capacity of the battery $E_o$ representing a nominal energy storage capacity of the battery. In the low battery power condition embodiment, SW1 and SW2 are opened, thereby bypassing the fixed battery estimator for determining an open circuit voltage. Instead, SW3 and SW4 are closed to input voltage and battery capacity signals 17C and 17D, respectively, into the adaptive battery estimator 80 to generate predicted battery terminal voltage signal 33A. A feedback control loop 35B, formed between the adaptive battery estimator 80, the battery current estimator 25 and the a priori battery resistance estimator 23 is used to update the internal battery resistance $\hat{R}_{b,chg}$ in a similar manner as described with respect to feedback control loop 35A, except that the predicted battery terminal voltage in feedback control loop 35B is input into the battery current estimator 25 from a predicted battery voltage signal 33A instead of signal line 27A to update and input both the estimated battery resistance and the estimated battery current into the adaptive battery estimator 80.

In an embodiment, the vehicle battery control module 14 samples and holds measured battery voltage during periods of low battery power (52). The vehicle battery control module 14 then operates to determine a rate limit (54) based upon the maximum rated capacity $E_o$ of the battery 18. The vehicle battery control module 14 then inputs the measured terminal voltage from the battery terminal voltage signal 17C and the estimated battery capacity $E_o$ from the estimated battery capacity signal 17D into the adaptive battery estimator 80 to generate a first estimated battery terminal voltage $\hat{V}_{oc}(k)$ when k equals 1 and a predicted battery terminal voltage when k is greater than 1 (55). The estimated or predicted battery voltage signal 33A is then input into feedback control loop 35B. The adaptive battery estimator 80 operates to adaptively estimate battery dynamics using Equations (11a)-(11c):

$$\text{If } |P^*(k)| < P \; \hat{V}_{oc}(k) = V(k) \tag{11a}$$

$$\text{If } P^*(k) > 0 \text{ then, } \hat{V}_{oc}(k) = \text{Rate\_lim}[\hat{V}_{oc}(k-1) - dV(k)] \tag{11b}$$

$$\text{If } P^*(k) < 0 \; \hat{V}_{oc}(k) = \text{Rate\_lim}[\hat{V}_{oc}(k-1) + dV(k)] \tag{11c}$$

Instead of using $V_{oc}$ for battery dynamics estimation, as is disclosed in FIGS. 2-4, another embodiment determines a rate limit of the change in battery voltage (54). The rate limit is formed as a function of the measured battery voltage and the maximum battery rated capacity $E_o$ communicated to the adaptive battery estimator 80 during when the battery is operating in a low battery condition. The change in measured battery voltage may be incremental and is determined using Equation (12):

$$dSOC_{est}(k) = -P \times (k) dT / E_0 \tag{12}$$

$$dV(k) = \frac{\partial V}{\partial SOC}\bigg|_{SOC_{est}(k)} \times dSOC_{est}(k)$$

wherein $SOC_{est}$ is the estimated state-of-charge, $E_0$ is the maximum battery rated capacity, and k is the time sample comprising an integer.

The estimated battery terminal voltage $V_{oc}$ from the last time sample (k−1) is then input (68) into feedback control loop 35B to determine an estimated battery current (26) and to update the internal battery resistance (28) as disclosed in Equations (2) and (3). For each time sample where k is greater than 1, the estimated voltage $\hat{V}_{oc}(k)$ from the last time sample becomes the predicted voltage. In the embodiment where the battery is in a low power state, SW1 and SW2 are opened, and SW3, SW4, and SW5 are closed. The adaptive battery estimator 80 adaptively predicts battery dynamics and uses battery dynamics inputs and equations (11a)-(11c) and (12) to determine a sensitivity factor (38), a covariance (40), an estimated or a predicted battery terminal voltage 33A (44).

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method of adaptively estimating battery dynamics using an adaptive battery control system in operative communication with at least one battery, comprising:
    estimating a battery terminal voltage, a battery internal resistance, and a battery current derived from a feed forward desired power request input and from a plurality of battery dynamics inputs; and
    determining a predicted battery terminal voltage, a predicted battery current, and an updated estimated battery internal resistance based on the estimated battery terminal voltage, the estimated battery internal resistance, and the estimated battery current.

2. A method of adaptively estimating battery dynamics using an adaptive battery control system in operative communication with at least one battery, comprising:
    estimating a battery terminal voltage, a battery internal resistance, and a battery current from a desired power request and from a plurality of battery dynamics inputs;
    determining a predicted battery terminal voltage, a predicted battery current, and an updated estimated battery internal resistance based on the estimated battery terminal voltage, the estimated battery internal resistance, and the estimated battery current;
    providing a fixed battery estimator in operative signal communication with the battery, with a power request signal, and with an a priori battery resistance estimator;
    estimating a battery terminal voltage from the fixed battery estimator based on an estimated open circuit voltage, an estimated battery internal resistance, an estimated battery current, and a desired power request;
    providing an adaptive battery estimator;
    inputting the estimated battery terminal voltage, the estimated battery internal resistance, and the estimated battery current into the adaptive battery estimator;
    predicting with the adaptive battery estimator a plurality of battery dynamics determined from the inputs received from the fixed battery estimator;
    determining a predicted battery terminal voltage, a predicted battery current, and an updated estimated battery internal resistance based on the estimated battery terminal voltage, the estimated battery internal resistance, and the estimated battery current determined by the fixed battery estimator and input into the adaptive battery estimator from the fixed battery estimator.

3. The method of adaptively estimating battery dynamics of claim 2, further comprising:
    outputting a predicted battery terminal voltage, a predicted battery current, and an updated battery internal resistance from the adaptive battery estimator to predict battery dynamics of the at least one battery.

4. The method of adaptively estimating battery dynamics of claim 2, further comprising:
    determining a battery open circuit voltage based on the estimated battery terminal voltage, wherein the estimated battery terminal voltage is a function of a state-of-charge signal output from a state-of-charge estimator;
    determining an estimated battery current based on the resulting estimated battery terminal voltage and a desired power request; and
    updating the estimated battery internal resistance based on the determined estimated battery current.

5. The method of adaptively estimating battery dynamics of claim 2, further comprising:
    inputting the estimated battery terminal voltage into a feedback control loop to update the estimated battery current and the estimated internal battery resistance; and
    updating both the estimated battery current and the estimated battery internal resistance based on an estimated battery terminal voltage from a previous time sample and from the power request signal via the feedback control loop.

6. The method of adaptively estimating battery dynamics of claim 2, further comprising:
    computing a statistical sensitivity factor based upon a change in the estimated battery terminal voltage with respect to a change in the estimated internal battery resistance;
    updating a covariance of values associated with power flowing through the battery and with the statistical sensitivity factor;
    calculating an update to the battery internal resistance based on the change in the estimated internal battery resistance; and
    determining a predicted battery terminal voltage based on the estimated battery terminal voltage, the desired power request, the change in the estimated internal battery resistance, and the estimated battery current.

7. The method of adaptively estimating battery dynamics of claim 2, further comprising:
    determining a change in the internal battery resistance corresponding to a battery discharging operating condition from a predefined software functionality module if power is flowing out of the battery.

8. The method of adaptively estimating battery dynamics of claim 2, further comprising:
    determining a change in an internal battery resistance corresponding to a battery charging operating condition from a predefined software functionality module if power is flowing into of the battery.

9. The method of adaptively estimating battery dynamics of claim 1, further comprising:
    determining an estimated battery terminal voltage based on a measured battery voltage and a maximum rated capacity of at least one battery associated with the adaptive battery estimation control system when the at least one battery is operating in a low power condition; and
    predicting battery dynamics based on the determined estimated battery terminal voltage.

10. A method of adaptively estimating battery dynamics using an adaptive battery control system in operative communication with at least one battery, comprising:
    estimating a battery terminal voltage, a battery internal resistance, and a battery current from a desired power request and from a plurality of battery dynamics inputs;
    determining a predicted battery terminal voltage, a predicted battery current, and an updated estimated battery internal resistance based on the estimated battery terminal voltage, the estimated battery internal resistance, and the estimated battery current;

determining an estimated battery terminal voltage based on a measured battery voltage and a maximum rated capacity of at least one battery associated with the adaptive battery estimation control system when the at least one battery is operating in a low power condition;

predicting battery dynamics based on the determined estimated battery terminal voltage;

sampling measured battery voltage during periods of low battery power;

holding the sampled measured battery voltage during periods of low battery power;

establishing a rate limit of the battery power based upon a maximum rated capacity of the battery; and using the held sampled measured battery voltage and the rate limit to adaptively determine battery dynamics.

11. The method of adaptively estimating battery dynamics of claim 9, further comprising:

predicting a battery terminal voltage based on a measured battery terminal voltage, a maximum rated capacity of a battery, an estimated battery internal resistance, an estimated battery current, and a the desired power request when a battery is operating in a low power condition.

12. The method of adaptively estimating battery dynamics of claim 11, further comprising:

outputting the predicted battery terminal voltage from an adaptive battery estimator into a feedback control loop to estimate a battery current and to update a battery internal resistance.

13. An adaptive battery estimation control system adapted to control at least one vehicle battery and electrical energy stored therein, comprising:

a vehicle battery control module in operative signal communication with the at least one vehicle battery, the vehicle battery control module including an adaptive battery estimator that receives a plurality of battery dynamic signals including an estimated battery terminal voltage signal, an estimated battery internal resistance signal, and an estimated battery current signal based on derivations from a feed forward desired power request input, wherein the adaptive battery estimator operates to determine a predicted battery terminal voltage, a predicted battery current, and an estimated battery internal resistance based on the plurality of battery dynamic signals into the adaptive battery estimator; and a power request signal in signal communication with the vehicle control module and with the at least one battery.

14. An adaptive battery estimation control system adapted to control at least one vehicle battery and electrical energy stored therein, comprising:

a vehicle battery control module in operative signal communication with the at least one vehicle battery, the vehicle battery control module including an adaptive battery estimator that receives a plurality of battery dynamic signals including an estimated battery terminal voltage signal, an estimated battery internal resistance signal, and an estimated battery current signal based on a desired power request, wherein the adaptive battery estimator operates to determine a predicted battery terminal voltage, a predicted battery current, and an estimated battery internal resistance based on the plurality of battery dynamic signals into the adaptive battery estimator;

a power request signal in signal communication with the vehicle control module and with the at least one battery;

a fixed battery estimator, the fixed battery estimator in operative signal communication with the battery, with the power request signal, and with the adaptive battery estimator when the battery is not in a low battery power condition, wherein the fixed battery estimator operates to determine an estimated battery terminal voltage, an estimated battery internal resistance, and an estimated battery current based on both an estimated open circuit voltage and the desired power request.

15. The adaptive battery estimation control system of claim 14, wherein the fixed battery estimator further comprises:

a state-of-charge estimator in signal communication with the vehicle battery and with a battery terminal voltage estimator to determine an estimated open circuit signal based on one of an estimated state-of-charge signal and a reported state-of-charge signal;

a battery current estimator adapted to determine an estimated battery current based on an estimated battery terminal voltage signal from a previous time sample, and based on a power request from the power request signal;

an a priori battery resistance estimator adapted to determine an estimated battery resistance from a battery current signal output from the battery current estimator; and said battery terminal voltage estimator in signal communication with the a priori battery resistance estimator and with the power request signal, wherein the battery terminal voltage estimator operates to determine an estimated battery terminal voltage based on signal inputs from the SOC estimator, from the a priori battery resistance estimator, and from the power request signal.

16. The adaptive battery estimation control system of claim 14, wherein the control module further comprises:

a feedback control loop including the estimated battery terminal voltage signal determined by and output from the fixed battery estimator, wherein the estimated battery terminal voltage signal from a previous time sample is input into the battery current estimator to determine an estimated battery current signal, and wherein the estimated battery current signal is output from the battery current estimator into the a priori internal resistance battery estimator to update an internal battery resistance signal.

17. An adaptive battery estimation control system adapted to control at least one vehicle battery and electrical energy stored therein, comprising:

a vehicle battery control module in operative signal communication with the at least one vehicle battery, the vehicle battery control module including an adaptive battery estimator that receives a plurality of battery dynamic signals including an estimated battery terminal voltage signal, an estimated battery internal resistance signal, and an estimated battery current signal based on a desired power request, wherein the adaptive battery estimator operates to determine a predicted battery terminal voltage, a predicted battery current, and an estimated battery internal resistance based on the plurality of battery dynamic signals into the adaptive battery estimator;

a power request signal in signal communication with the vehicle control module and with the at least one battery;

a predicted voltage signal output from the adaptive battery estimator into a feedback control loop, wherein the feedback control loop is in signal communication with the adaptive battery estimator, a battery current estimator, and an a priori battery estimator.

* * * * *